United States Patent [19]
Zingrini et al.

[11] Patent Number: 5,107,993
[45] Date of Patent: Apr. 28, 1992

[54] SUBRACK FOR TELECOMMUNICATION EQUIPMENT

[75] Inventors: Carlo Zingrini, Vimercate; Maurizio Oreglio, Bellinzago Lombardo; Domenico Ronchi, Cambiago, all of Italy

[73] Assignee: Telettra S.p.A., Italy

[21] Appl. No.: 589,445

[22] Filed: Sep. 27, 1990

[30] Foreign Application Priority Data

Oct. 31, 1989 [IT] Italy ................................. 22232/89

[51] Int. Cl.$^5$ ................................................ A47F 5/00
[52] U.S. Cl. ...................................... 211/41; 211/26; 211/189
[58] Field of Search ........................... 211/41, 26, 189

[56] References Cited

U.S. PATENT DOCUMENTS

| | | | |
|---|---|---|---|
| 4,407,416 | 10/1983 | Anderson | 211/41 |
| 4,505,392 | 3/1985 | Erlam | 211/26 |
| 4,508,228 | 4/1985 | Erlam | 211/41 |
| 4,531,640 | 7/1985 | Shah | 211/41 |
| 4,690,286 | 9/1987 | Horne et al. | 211/26 X |

Primary Examiner—Robert W. Gibson, Jr.
Attorney, Agent, or Firm—Ostrolenk, Faber, Gerb & Soffen

[57] ABSTRACT

A subrack for supporting cards and printed circuit boards (PSC) for telecommunication equipment which allows complete use of the space available for these cards and circuit boards, while meeting the DIN 41494-IEC 297 standard, with a pitch at least 4 times lower than the pitch required by this standard. The subrack includes undrilled crosspieces, provided only with grooves, one of which is associated with a positioning toothing with teeth forming a rack, having a pitch equal to half of the pitch of drillings of conventional crosspieces. The teeth are inserted into seats machined into the guide of the printed circuit board, each seat being offset by a quarter of the pitch required by the standard. Therefore, by successive turning of the boardguide by 180°, a series of real pitches is obtained which is a quarter of the minimum pitch required by the standard.

11 Claims, 12 Drawing Sheets

SUBRACK FOR TELECOMMUNICATION EQUIPMENT

BACKGROUND OF THE INVENTION

1Field of the Invention

The present invention relates to a subrack for housing electronic circuits, in particular in the form of cards or printed circuit boards for telecommunication equipment. The subrack is formed by four crosspieces supplied with means offset by a certain pitch along the axle of each crosspiece for being engaged with corresponding insertion means provided onto the bottom of the boardguides. Each crosspiece is supplied with grooves for being fixed to the sides and with a groove for snap insertion with the boardguides.

2. Description of the Related Art

The importance of subracks in the telecommunication systems is well known; they must allow the maximum number of printed circuit boards to be housed in the least possible volume, while at the same time meeting international standards such as DIN 41494-IEC 297.

Also well known is the continuous tendency to miniaturize electronic circuits, that is often at least partially offset by the lack of timely and suitable modifications of the mechanical structures that must house them.

In practice, subracks are typically formed up of four crosspieces that are redundantly supplied with drillings.

A second drawback added to this first drawback, arises from the fact that the pitch of the drillings is 5 08 mm, consequently the minimum pitch of the housing of printed circuits is made, in accordance with the standard DIN 41494-IEC 297, as a multiple of 5.08 (1/5 inch).

This minimum pitch is too low for telecommunication equipment (usually in continuous development), as it requires making unit dimensions that are multiple of 5.08 (e.g. 20.32, 25.4, 30.48, etc.).

SUMMARY OF THE INVENTION

A first objective of the present invention is to provide subracks that do not have the above mentioned drawbacks and that in particular are formed by elements that require a lesser number of mechanical machinings.

Another objective of the present invention is to provide a subrack that, formed by undrilled elements, allows optimal use of the available space of the printed circuit boards, while meeting the above mentioned DIN standards and that further offers the possibility of providing much lower pitches.

A further objective of the invention is to provide a subrack that, using undrilled crosspieces and very low pitches, has great flexibility when combined with the wide selection of the real pitches of the housing.

These and further objectives are realized by the subrack according to the invention, wherein each crosspiece is associated with a groove, in which a positioner is present having teeth projecting upwards adapted to be housed in corresponding seats projecting towards the bottom starting from the bottom of the boardguides. A further feature of the invention is that the pitch (P) of teeth is equal to half of the minimum conventional pitch (Pmin) of the DIN standard. Advantageously, the new minimum pitch (P'min) becomes at least one quarter of the pitch of conventional holes.

According to another particularly advantageous feature of the invention, the seats of the boardguides to be engaged with the positioner teeth are formed by at least two lateral walls spaced at least as far apart as the tooth thickness having a misalignment or eccentricity (DIS). Preferably, the misalignment is equal one quarter of the pitch of the positioner teeth.

A particularly advantageous effect is obtained in that, by turning the boardguide 180°, the misalignment is added or subtracted to the housing pitch that can be selected in a series of three values.

In the first embodiment of the invention, the positioner with rack teeth is an additional part that is coupled with the crosspiece, while in a second embodiment, the positioner is integrally formed in the same crosspiece which forms the subrack.

BRIEF DESCRIPTION OF THE DRAWINGS

Various features and advantages of the present invention will better understood when the following detailed description of the preferred embodiments is read in conjunction with the accompanying drawing in which.

DETAILED DESCRIPTION OF THE PREFERRED EMBODIMENTS

Figure 1:
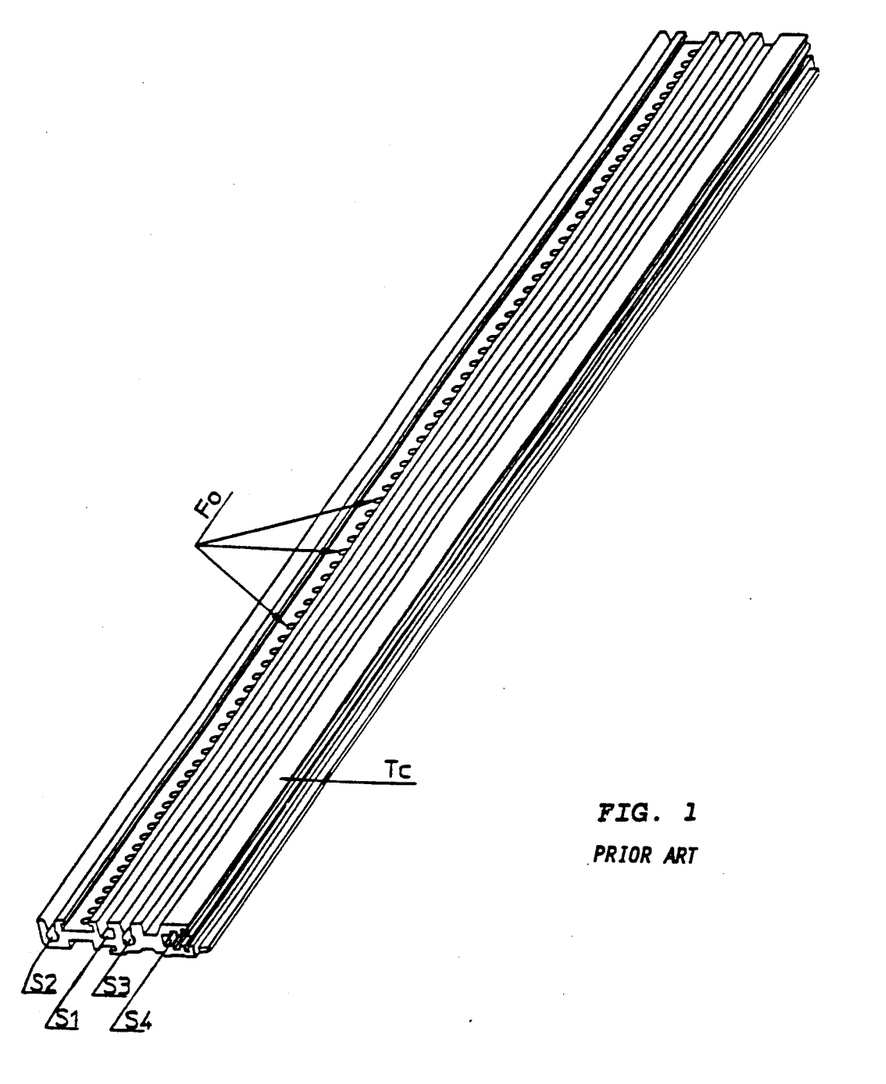
FIGS. 1 and 2 are schematic and partial perspective views of a single crosspiece respectively, of a typical prior subrack.
Figure 2:
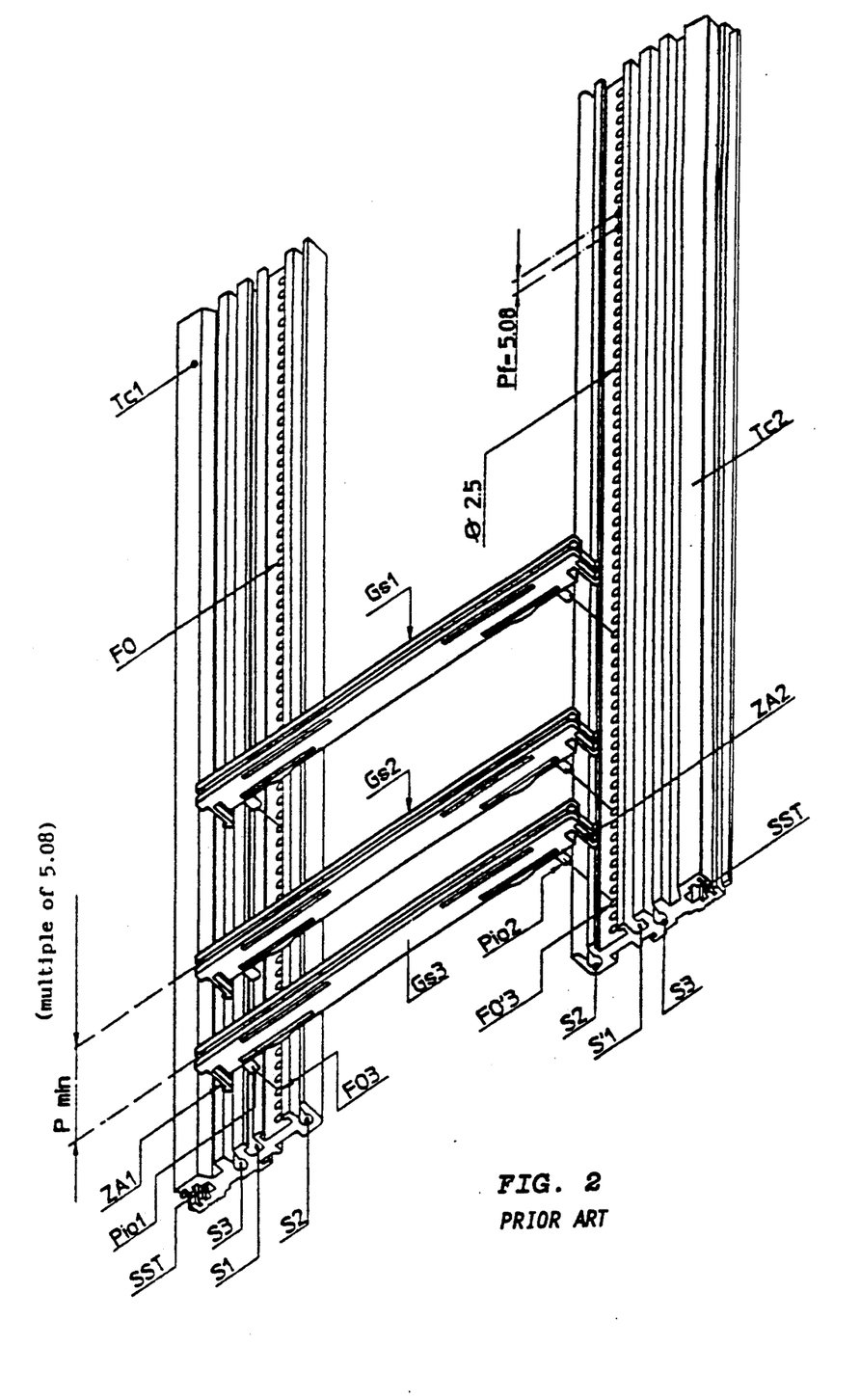

FIG. 1 shows a conventional crosspiece Tc with a long series of holes FO and four grooves S1, S2, S3, S4; the manufacture of this crosspiece requires relatively complex machining. As shown in related FIG. 2, two crosspieces Tc1 and Tc2, each one having the holes FO with pitch 5.08, that is 1/5 inch, receive the boardguides GS1, GS2, GS3, each of which has two stacks Pio1, Pio2 engageable into the aligned holes FO3, FO'3 and two legs ZA1, ZA2 snap-engageable into the related grooves S1-S'1.

Figure 3:
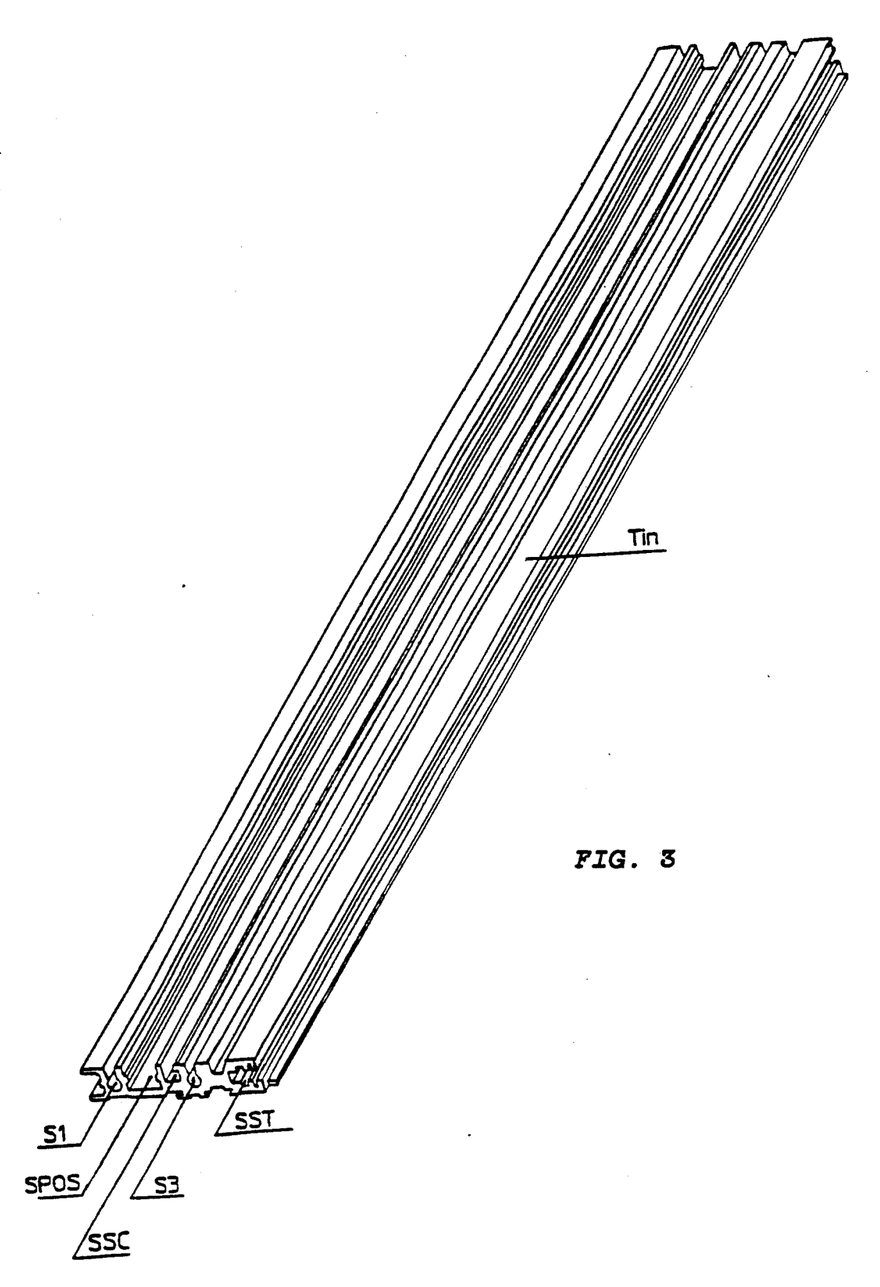
FIGS. 3 and 4 are views similar to the views of FIGS. 1 and 2 of a crosspiece and related subrack according to the invention.
Figure 4:
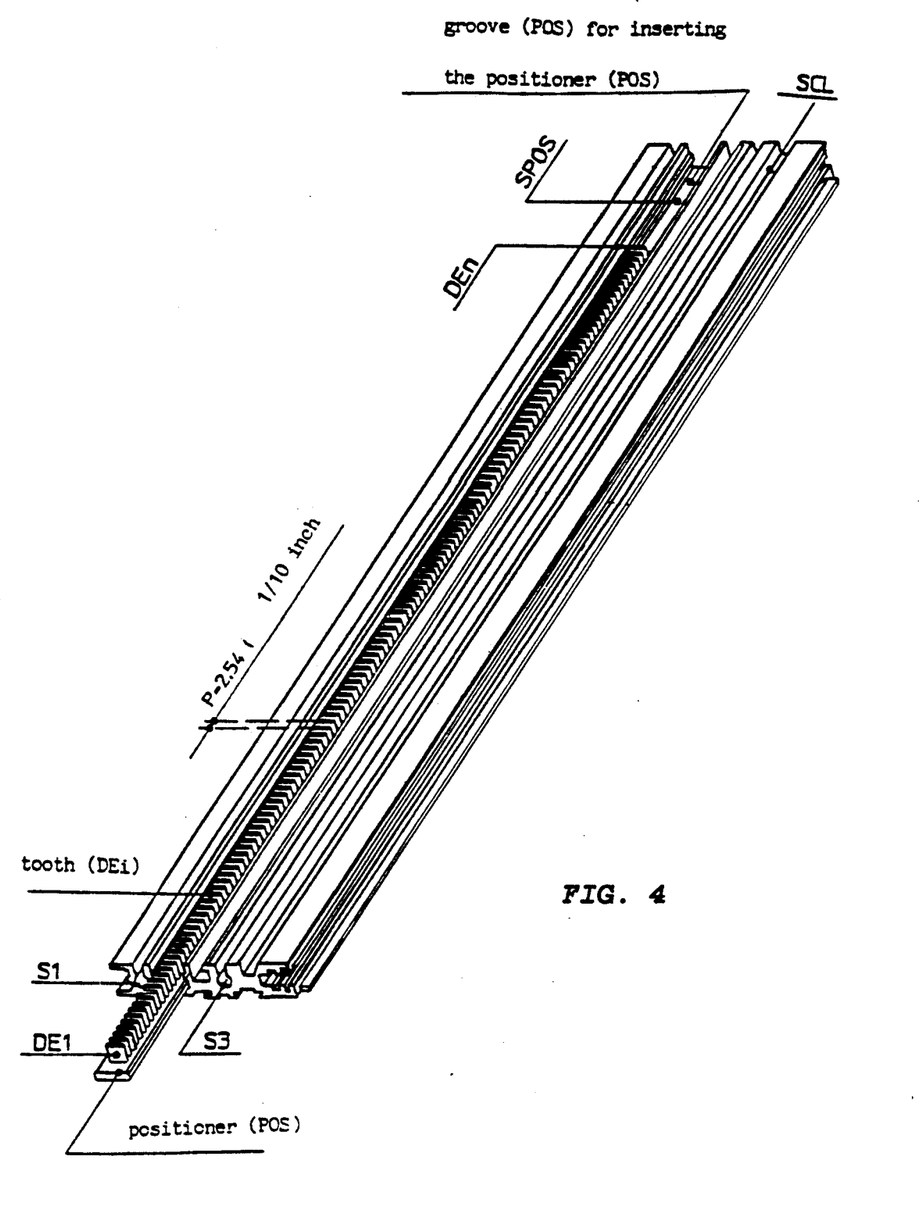
Figure 5:
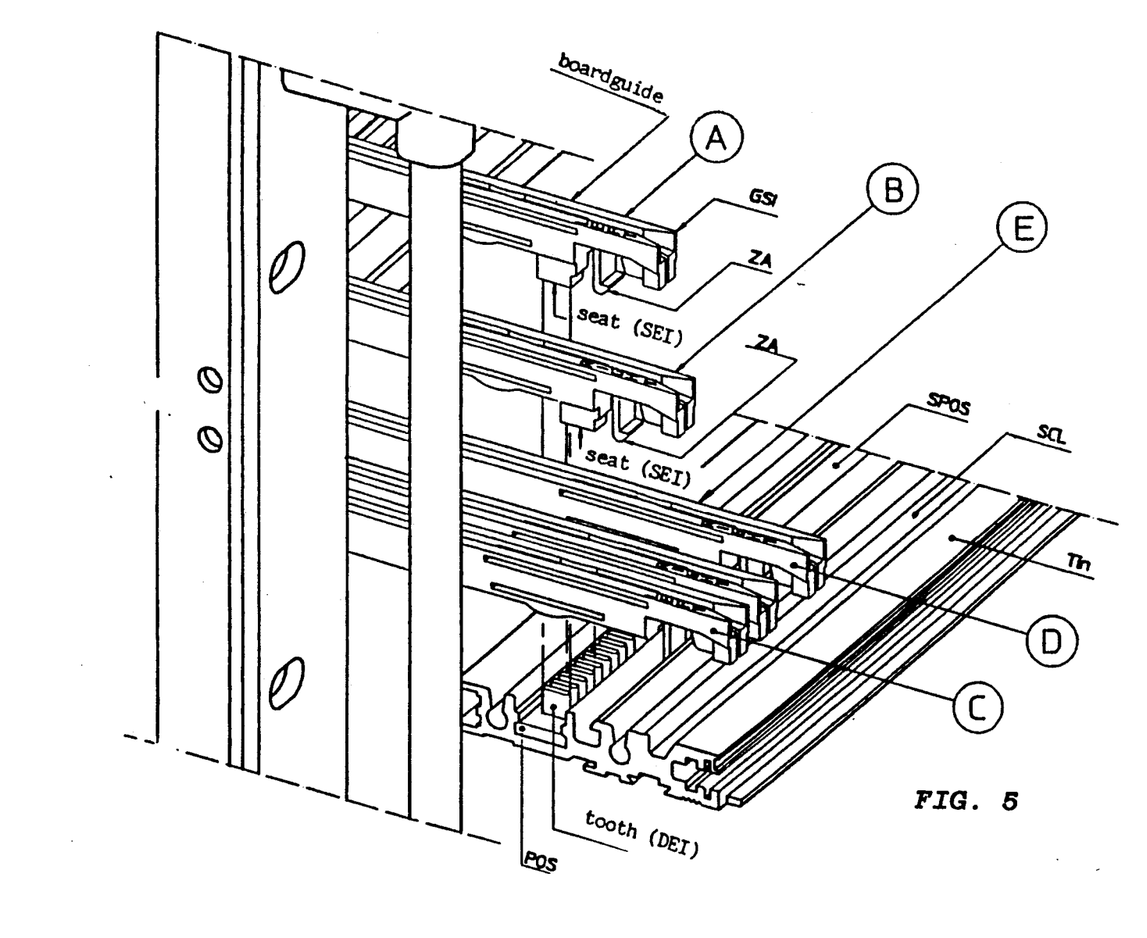
FIG. 5 is a schematic exploded perspective view of a base of the subrack according to the invention with five boardguides designed from A to E.

Owing to the difficult machining required, the holes must have a minimum suitable diameter, e.g. of 2.5 mm, with a minimum pitch (Pf) according to DIN 41494 IEC 297 of 5.08 mm (1/5 inch); therefore, the housing pitch Pmin (the distance between two following printed circuits) is necessarily a multiple of Pf, that is PAoin=nPf. According to the invention (FIGS. 3 and 4), the new crosspiece Tin no longer has drillings FO; it has the two grooves S1 and S3 for fastening the same crosspiece to the body side F1 of the subrack, and the groove SSC for snap-fastening the boardguides GSi according to a first feature of the invention, it also has a groove SPOS that houses or forms a positioner POS with a series of teeth from DE1 and DEn forming the rack (FIGS. 4 and 5). In the figures, part SST identifies the conventional groove for inserting threaded bars normally used for fastening front plates, connecter-holder brackets, rear parts (back panels), etc.

As FIG. 4 shows, the pitch between the teeth is e.g. P=2.54 (i.e. 1/10 inch).

The minimum pitch P'min now becomes at least a quarter of the minimum conventional pitch P'min=- Pmin/4=5.08/4=1.27; i.e., 1/20 inch. This very advantageous P'min yields a dimension of unit housing which is a multiple of 1.27 (e.g., 20.32; 21.59; 22.86; 24.13; 25.4), thus allowing a complete and optimal use of the space at disposal for the printed circuits without violating the standard DIN 41494 IEC 297.

A first embodiment of the tooth positioner FOS is formed by a body that is formed separately and is then inserted into the groove SPOS.

Preferably, the positioner FOS is a molded object made of plastic material.

In another embodiment, the positioner POS is formed integrally directly in the crosspiece and/or forms a single body therewith, e.g. with the groove SPOS.

In accordance with another important feature of the invention, the tooth DEi of the positioner POS is housed into a seat SEi (FIG. 5) machined in the boardguide GS1. As can be seen in better detail in FIGS. 6–6i, the seats SEI have a fork form, each of which having two protruding legs Gz—Gz' suitable to be encased onto a tooth DEi of the positioner (POS). The seats SEi have an eccentricity or misalignment DIS that, in the more simple and preferred fulfilment form, is equal to a fourth of the tooth pitch P, that is DIS=P/4=2.54/4=0.635 (i.e. 1/40 inch).

By turning the boardguide by 180°, the misalignment (DIS) can be made positive 0.635) or negative (−0.635) with respect to the axle of the positioner tooth; therefore a real pitch of housing (PE) can be obtained which is equal to:

$PE1 = (n \times P) - (2 \times DIS) = (10 \times 2.54) - (2 \times 0.635) = 24.13$
$PE2 = (n \times P) - (2 \times DIS) = (10 \times 2.54) - (2 \times (-0.635)) = 26.27$
$PE3 = (n \times P) - DIS + DIS = (10 \times 2.54) - 0.635 + 0.635 = 25.4$ (with n being equal to 10).

FIG. 5 shows, in perspective view, a crosspiece Tin with a positioner indicated by POS that houses five boardguides A, B, C, D, E.

Figure 6:
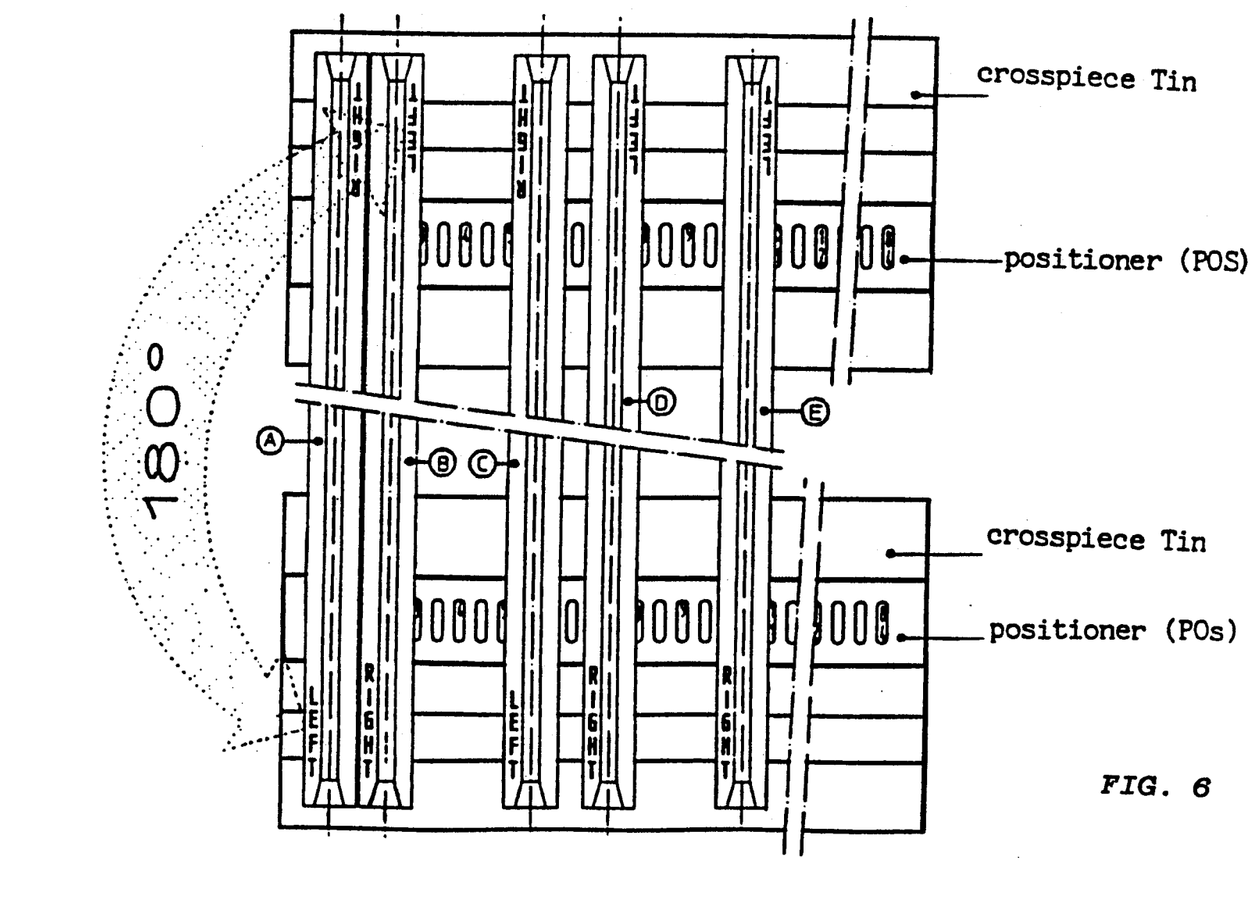
FIG. 6 is a schematic plan view of FIGS. 5 and 6i.
Figure 6A:
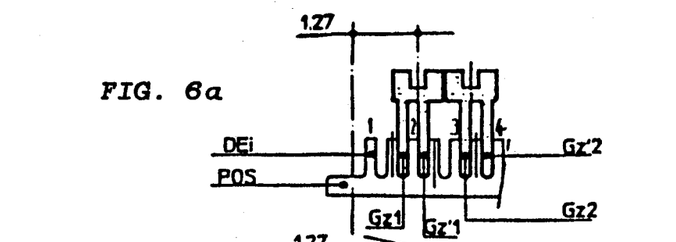
FIGS. 6a-6i are partial section views of the different possible eccentricities or misalignments of the seats (SEi) of the boardguides and different possible couplings and real pitches with the teeth of a positioner according to the invention, FIG. 6l being to the contrary a similar schematic section of a crosspiece of the art.
Figure 6B:
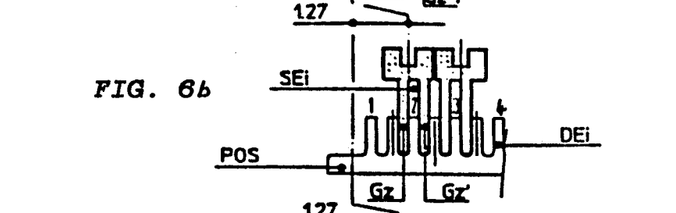
Figure 6C:
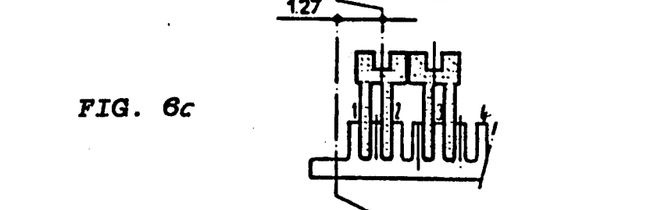
Figure 6D:
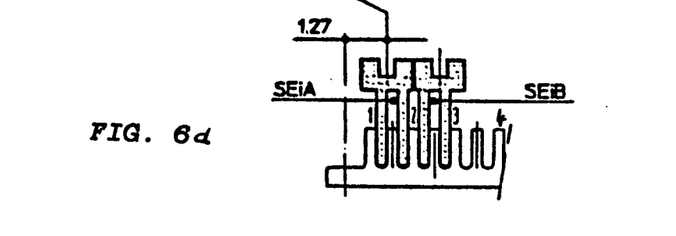
Figure 6E:
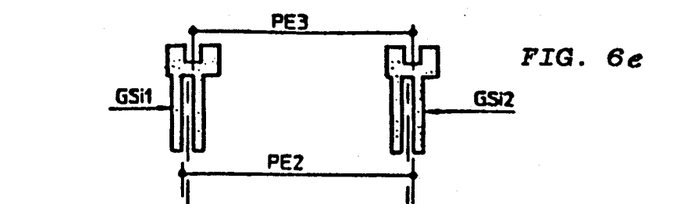
Figure 6F:
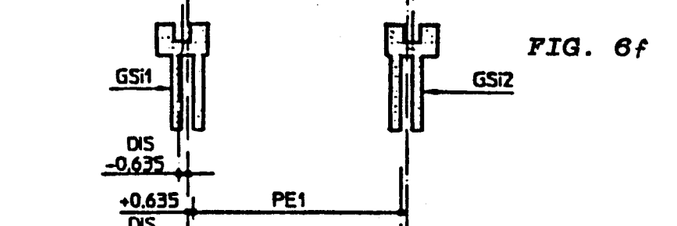
Figure 6G:
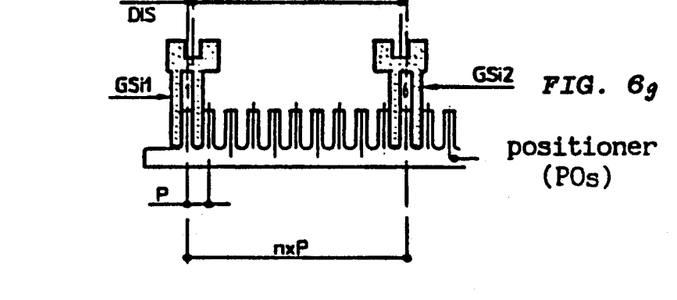

FIG. 6 shows the boardguides A and B, as well as C and D, turned with respect to one another, while the boardguide E is not turned with respect to D or with respect to B.

Figure 6H:
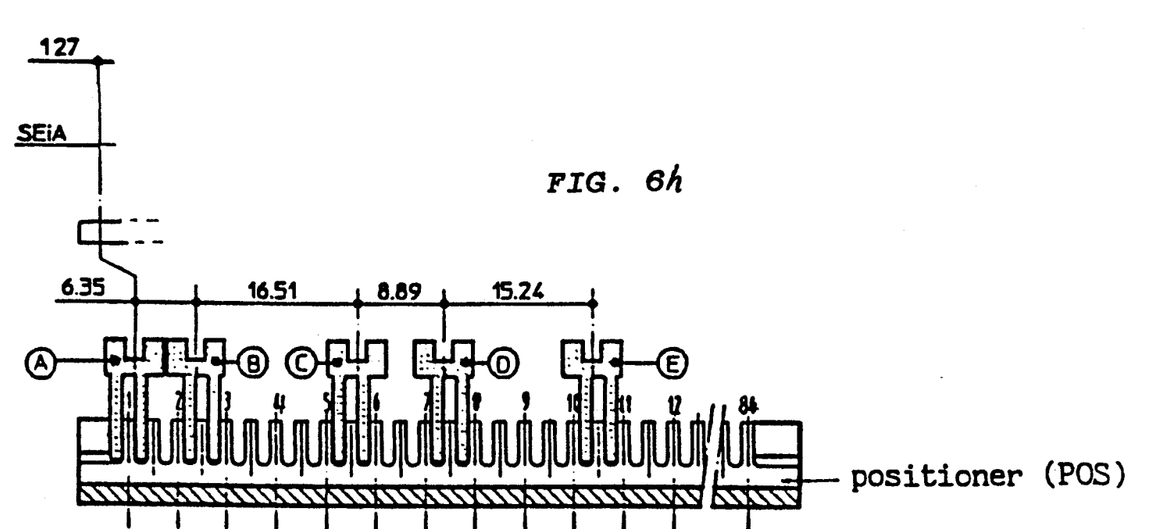
Figure 6I:
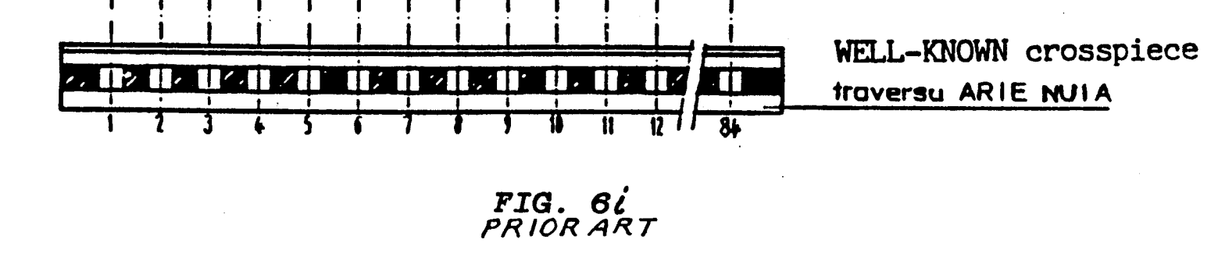

FIGS. 6a through 6i show respectively:

FIGS. 6 and 6h are plan, respectively, front views of the boardguide A, B, C, D, E in different possible assembly positions/rotations.

FIGS. 6a, 6b, 6c and 6d show, respectively, the traverse of the pitch by progressive increments e.g. of 1.27 (equal to 1/20 inch) in increasing order from one figure to the next; starting from the position of FIG. 6d, the position of FIG. 6c is obtained by the rotation of SEiA and SEiB by 180°, while keeping the tooth (DEi) constantly engaged between 1 and 2. The position of FIG. 6b is obtained from the position of FIG. 6d without rotation, but instead by inserting the teeth 2 and 3 with one another.

FIG. 6a is similar to the FIG. 6b, but showing the further rotation of the boardguides by 180°, keeping teeth 2 and 3 constant.

FIGS. 6e, 6f, and 6g represent, respectively, the real pitches PE1, PE2 and PE3 where, with e.g. PE1 as the start pitch, PE2 is obtained by turning GSi1 by 180° and engaging the seat of the same boardguide on the tooth 1 of the positioner and turning GSi2 by 180° and keeping the tooth of the positioner engaged.

PE3 is obtained by turning GSi1 by 180° with respect to GSi1 of the FIG. 6f, keeping the tooth of the positioner engaged and keeping GSi2 fixed with respect to the same GSi2.

Figure 7:
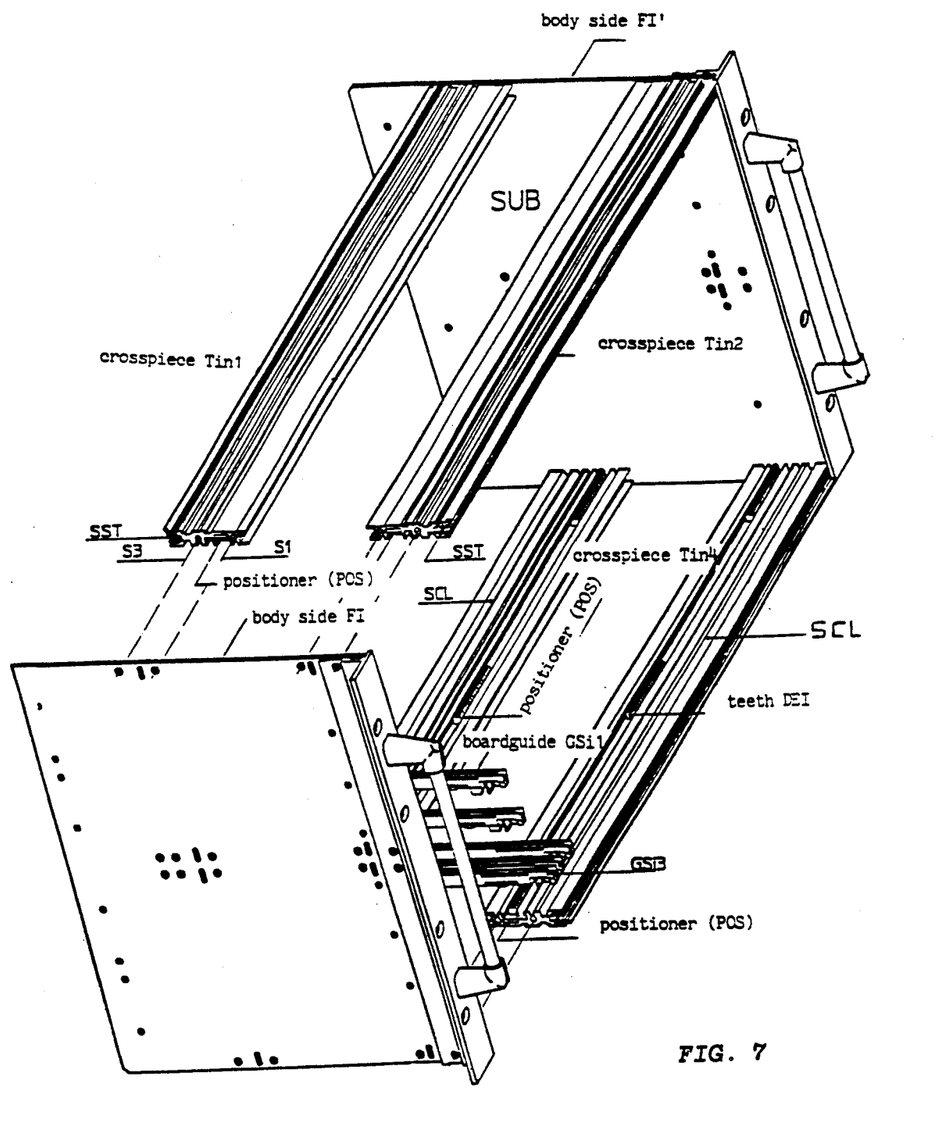
FIG. 7 is a schematic exploded perspective view of an assembled subrack according to the invention.
Figure 10:
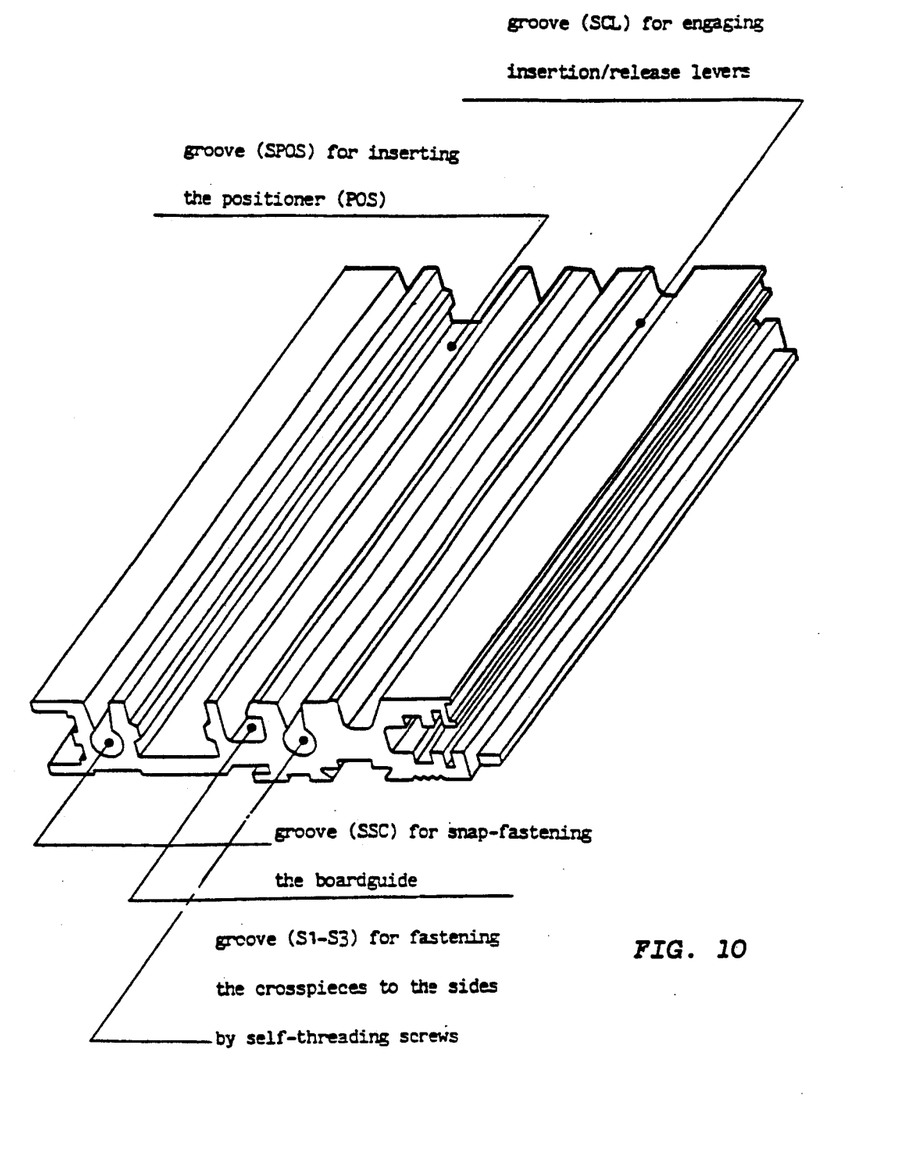
FIG. 10 is an enlarged perspective view of a crosspiece according to the invention, that better shows the different grooves, the positioner being removed.

FIG. 7 shows, in perspective partial exploded view, a subrack with four crosspieces Tin1, Tin2, Tin3, Tin4, each with applied positioner and each being fixed to the body sides FI, FI' by self-threading screws V (FIG. 8), that are engaged into the grooves S1 and S3. The crosspieces are of the type represented in enlarged scale in FIG. 10, showing how the end groove SCL for engaging the insertion levers and releasing the electronic devices is provided in addition to the groove SSC for snap-engaging with the legs ZA of the boardguides (GSi).

Figure 8:
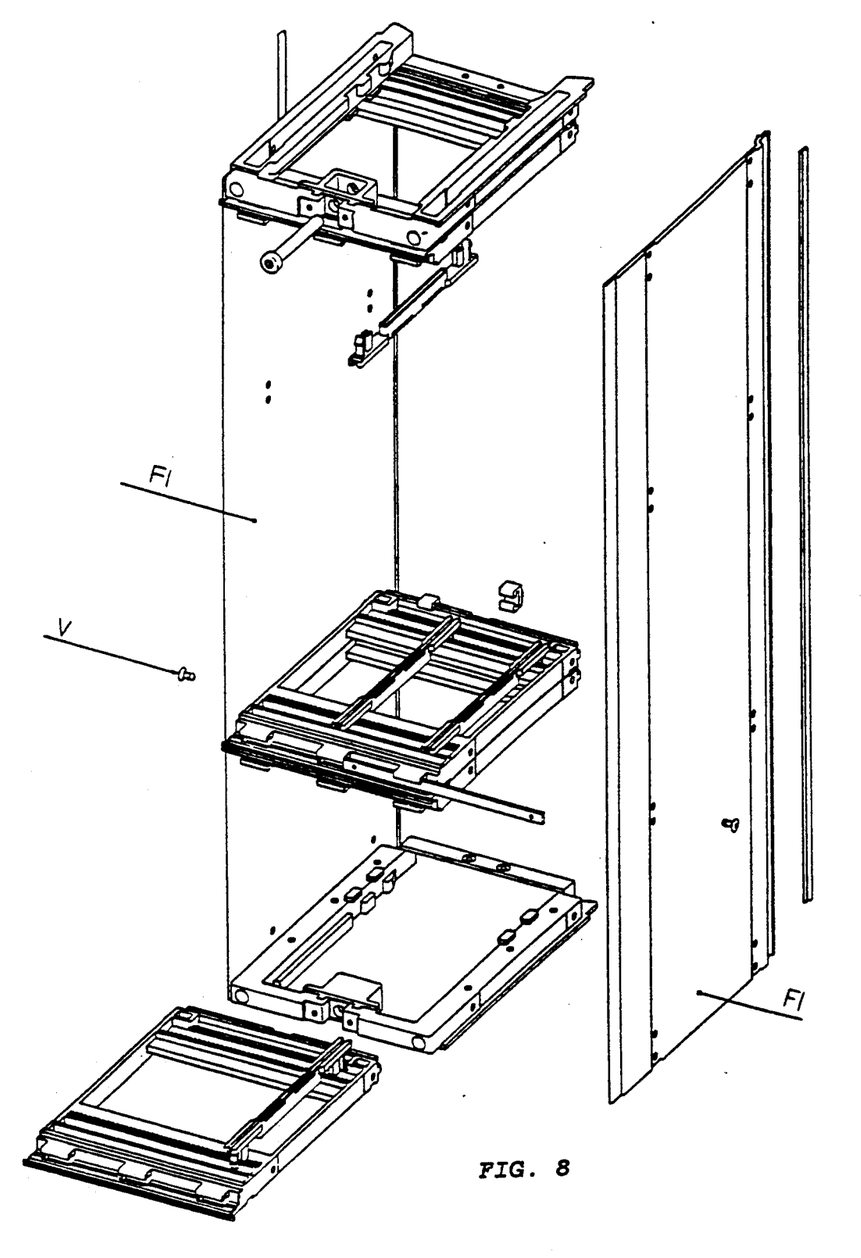
FIG. 8 is an schematic exploded perspective view of a subrack according to the second embodiment of the invention.
Figure 9:
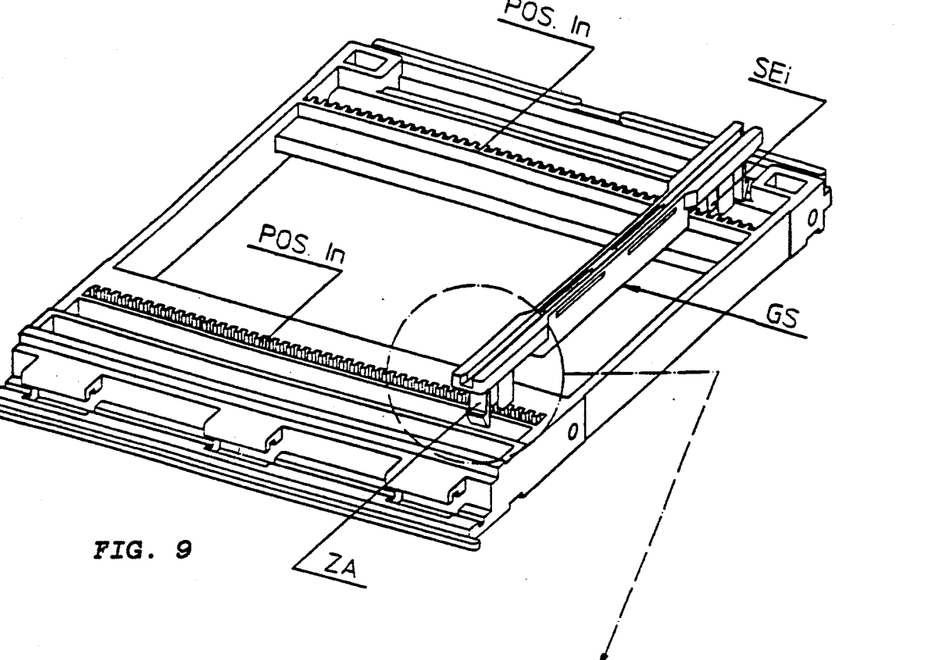
FIGS. 9 and 9a are schematic exploded perspective views of an embodiment of the invention with the position directly on the crosspiece.

FIG. 8 is a perspective exploded view of a subrack in accordance with the second embodiment (FIG. 9).

Figure 9A:
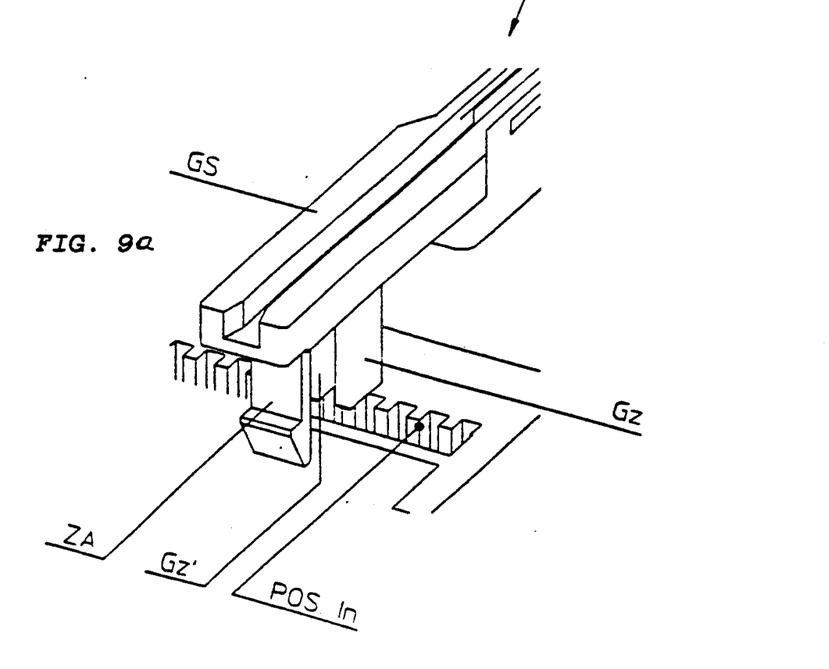

As indicated, FIG. 9 represents the second embodiment with the positioner in a single body POS.In with the crosspiece; FIG. 9a shows in enlarged scale the engagement of a boardguide GS with its seat SEi onto the teeth of the embodied positioner POS.In.

What is claimed is:

1. A subrack for housing electronic circuits such as cards or printed circuit boards (PCS) for telecommunication equipment comprising:

four crosspieces, each of said crosspieces having a first groove for attachment to a subrack body side, a second groove for snap-connection with a plurality of boardguides, and a third groove housing a positioner, said positioner having upwardly projecting teeth wherein said teeth are adapted to be housed in corresponding seats projecting from the underside of said boardguides.

2. A subrack according to claim 1, wherein the pitch (P) of the teeth is equal to half of the minimum conventional pitch (Pmin) required by the standard DIN 41494 IEC 297.

3. A subrack according to claim 2, wherein the new minimum pitch (P'min) is at least ¼ of said minimum conventional pitch.

4. A subrack according to claim 3, wherein said sets are formed by at least two lateral walls spaced at least as far apart as the thickness of said tooth and being offset by a misalignment or eccentricity (DIS).

5. A subrack according to claim 4, wherein the misalignment (DIS) is equal to one fourth of the pitch (P) of said upwardly projecting teeth of the positioner.

6. A subrack according to claim 5, wherein said misalignment can be added or subtracted by turning the boardguides 180°.

7. A subrack according to claim 6, wherein the minimum conventional pitch according to standard DIN 41494-IEC 297 is equal to 5.08 mm (1.5 pitch), the pitch (P) of said upwardly projecting teeth on the positioner is P'min/2=2.54 and the new minimum pitch is at least P'min/4=1.27.

8. A subrack according to claim 7, wherein the misalignment (DIS) is equal to one fourth of the pitch of said upwardly projecting teeth, that is P/4=2.54/4=0.635 (1/40inch).

9. A subrack according to claim 8, wherein a play of the misalignment (DIS) of said seats and the rotation by 180° of the boardguides results in three real housing pitches (PE1, PE2, PE3), with values of 24.13, 26.67, and 25.4, respectively.

10. A subrack according to claim 12, wherein the positioner is a preformed piece made of plastic material that is inserted into said third groove of the crosspiece.

11. A subrack according to claim 12, wherein the positioner is formed integrally with the crosspiece and forms a single body with said third groove.

* * * * *